United States Patent [19]
Yagi

[11] Patent Number: 5,559,821
[45] Date of Patent: Sep. 24, 1996

[54] SEMICONDUCTOR LASER

[75] Inventor: Tetsuya Yagi, Itami, Japan

[73] Assignee: Mitsubishi Denki Kabushiki Kaisha, Tokyo, Japan

[21] Appl. No.: 519,703

[22] Filed: Aug. 28, 1995

[30] Foreign Application Priority Data

Sep. 2, 1994 [JP] Japan .................... 6-209981

[51] Int. Cl.$^6$ ............................ H01S 3/19
[52] U.S. Cl. ............................ 372/46; 372/45
[58] Field of Search ............................ 372/45, 46

[56] References Cited

U.S. PATENT DOCUMENTS 5,408,487  4/1995  Uchida et al. ...................... 372/45

FOREIGN PATENT DOCUMENTS 3225985  10/1991  Japan .

OTHER PUBLICATIONS

Matsumoto et al, "High–Power Self–Sustained 780nm Low–Noise Semiconductor Laser Diodes", Japan Society of Applied Physics . . . Extended Abstracts, 1994, p. 24p–K–8 (No Month).

Goto et al, "Low– Noise And High–Power GaAlAs Lasers With A Saturatable Absorbing Layer", Japan Society of Applied Physics . . . Extended Abstracts, 1994, p. 28p–K–9 (No Month).

Yagi et al, "Inverted Inner Stripe Laser With A p–GaAs Buffer Layer Grown By MOCVD", 20th Conference on Solid State Devices and Materials, Extended Abstracts, 1988, pp. 303–306 (No Month).

*Primary Examiner*—James W. Davie
*Attorney, Agent, or Firm*—Leydig, Voit & Mayer

[57] ABSTRACT

A superlattice layer is introduced in the ridge stripe structure of a buried ridge type semiconductor laser. This superlattice layer captures and redirects the propagation of a dislocation which occurs due to a shearing stress created in the crystalline structure during either an epitaxial growth or a cooling process following the epitaxial growth. This superlative layer eliminates the possibility of a through dislocation penetrating the laser active region under the ridge stripe structure so that optical loss along a waveguide can be avoided. Consequently, a semiconductor laser with a long lifetime and superior characteristics is obtained.

8 Claims, 7 Drawing Sheets

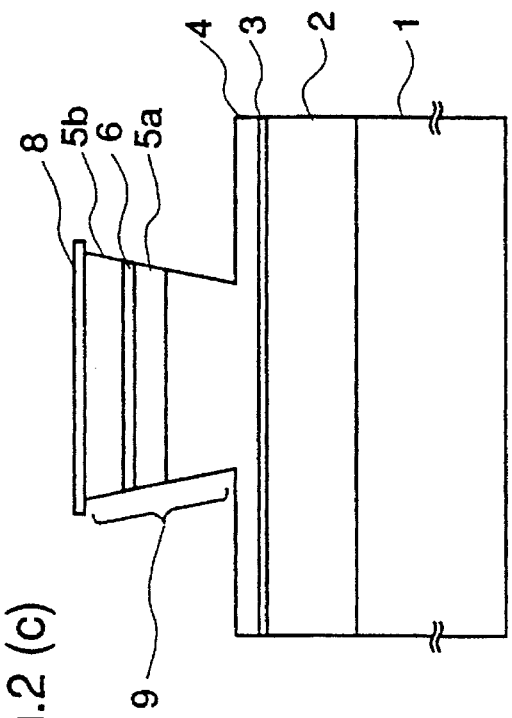
Fig.2 (a)
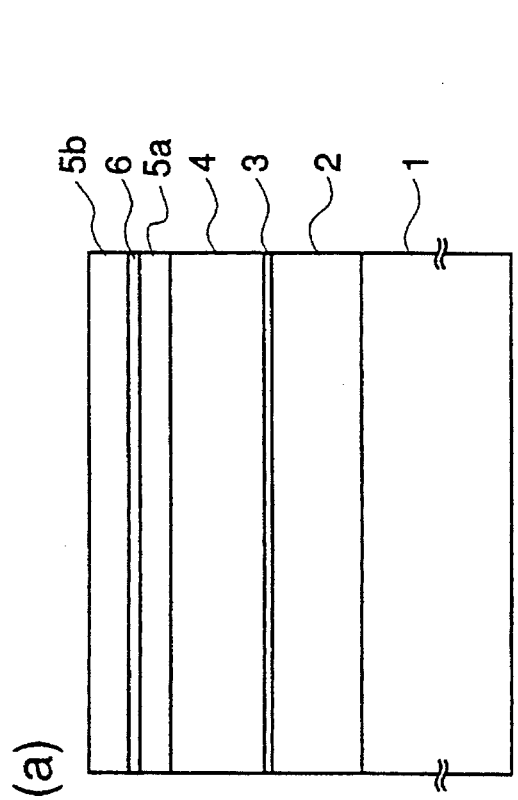
Fig.2 (b)
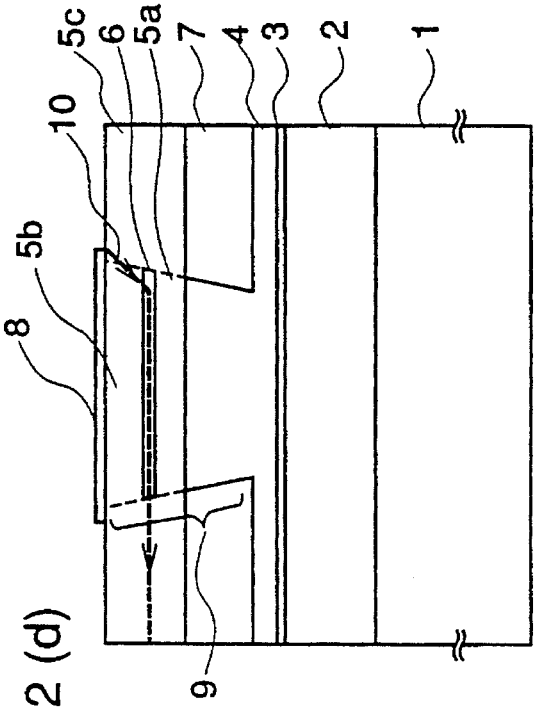
Fig.2 (c)
Fig.2 (d)

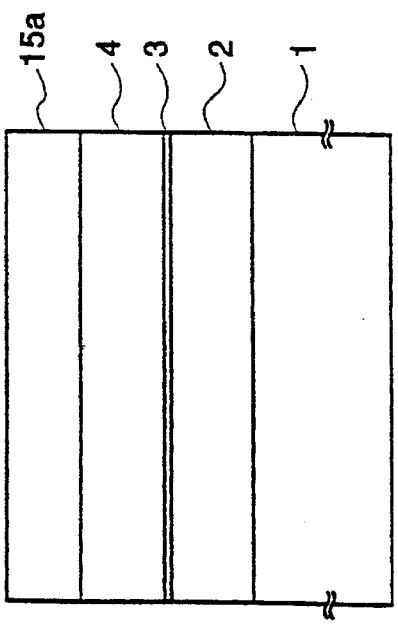
Fig.6 (a) (PRIOR ART)
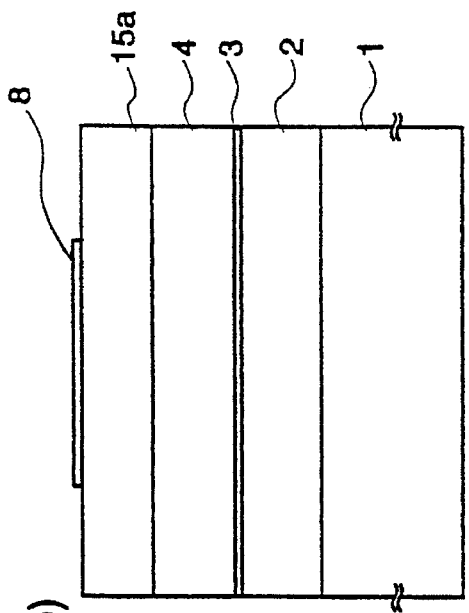
Fig.6 (b) (PRIOR ART)
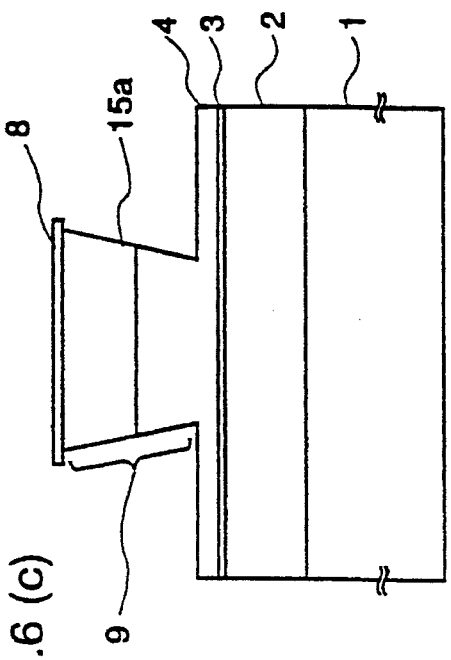
Fig.6 (c) (PRIOR ART)
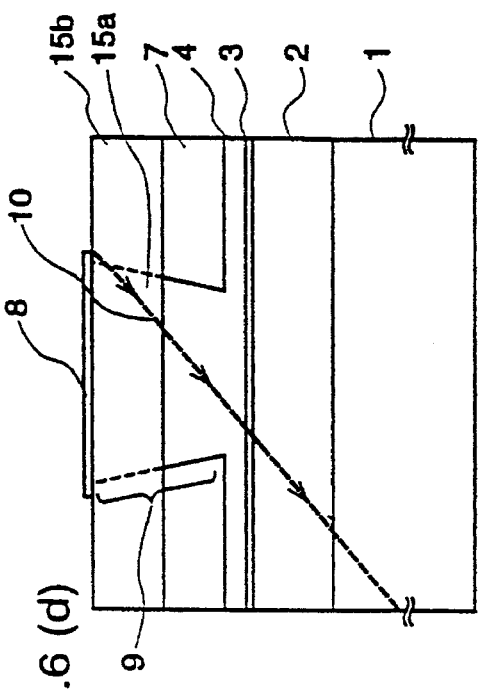
Fig.6 (d) (PRIOR ART)

5,559,821

SEMICONDUCTOR LASER

FIELD OF THE INVENTION

The present invention relates to a semiconductor laser and, more particularly, to a buried ridge type semiconductor laser fabricated by metal organic chemical vapor deposition.

BACKGROUND OF THE INVENTION

FIG. 5 is a cross-sectional view illustrating the structure of a conventional buried ridge type semiconductor laser including an n type GaAs substrate 1, an n type $Al_{0.48}Ga_{0.52}As$ lower cladding layer 2, an undoped $Al_{0.13}Ga_{0.87}As$ active layer 3, a first p type GaAs contact layer 15a, a p type $Al_{0.48}Ga_{0.52}As$ upper cladding layer 4, a ridge stripe structure 9 comprising the first p type GaAs contact layer 15a and the upper part of the upper cladding layer 4, an n type GaAs current blocking layer 7 burying the p type $Al_{0.48}Ga_{0.52}As$ upper cladding layer 4 of the ridge stripe structure 9, a second p type GaAs contact layer 15b burying the p type GaAs contact layer 15a of the ridge stripe structure 9, an n side electrode 16, and a p side electrode 17.

FIGS. 6(a) to 6(d) are cross-sectional views illustrating fabrication of a conventional buried ridge type semiconductor laser in which the same reference numerals used in FIG. 5 designate the same or corresponding elements. Reference numeral 8 designates an insulating film of stripe configuration extending in the <110> direction and comprising a material such as SiON or SiN, and reference numeral 10 designates a dislocation.

Next, the fabrication method will be described. First, the n type $Al_{0.48}Ga_{0.52}As$ lower cladding layer 2, the undoped $Al_{0.13}Ga_{0.87}As$ active layer 3, the p type $Al_{0.48}Ga_{0.52}As$ upper cladding layer 4, and the first p type GaAs contact layer 15a are successively epitaxially grown in a first epitaxial growth step on the (001) surface of the n type GaAs substrate 1, whereby the semiconductor layer structure shown in FIG. 6(a) is produced. This first epitaxial growth step employs ordinary methods used in fabricating semiconductor devices, such as metal organic chemical vapor deposition (MOCVD) or molecular beam epitaxy (MBE). Next, the SiON film 8 having a stripe configuration extending in the <110> direction is formed on the semiconductor layer structure produced by the first epitaxial growth step (FIG. 6(b)). This SiON film 8 should have a thickness of 50 to 100 nm and is commonly produced by plasma CVD. Next, using this insulating film 8 as an etching mask, the semiconductor layer structure is etched into the p type $Al_{0.48}Ga_{0.52}As$ cladding layer 4 to produce the ridge stripe structure 9 (FIG. 6(c)). Then, using the insulating film 8, the n type GaAs current blocking layer 7 is selectively grown, in a second epitaxial growth step employing MOCVD, to bury the p type $Al_{0.48}Ga_{0.52}As$ cladding layer 4 of the ridge stripe structure 9, at a temperature of about 650° C. The second p type GaAs contact layer 15b is then grown to bury the first p type GaAs contact layer 15a of the ridge stripe structure 9. Then, the semiconductor structure is cooled to about 500° C. (FIG. 6(d)) and, finally the p side electrode 17 and the n side electrode 16 are formed on the surfaces of the contact layers 15a and 15b and on the rear surface of the substrate 1, respectively, whereby the semiconductor laser shown in FIG. 5 is completed.

Next, operation of the semiconductor laser will be described with reference to FIG. 5. When a bias voltage is applied to the p side electrode 17 and the n side electrode 16 so that the first p type GaAs contact layer 15a and the second p type GaAs contact layer 15b become positive, since in a region where the ridge stripe structure 9 does not exist there is a thyristor structure (p-n-p-n junction) comprising the second p type contact layer 15b, the n type current blocking layer 7, the p type upper cladding layer 4, and the n type lower cladding layer 2, an electrical current only flows through the ridge stripe structure 9 and not through the thyristor structure. Electrons and holes injected into the region of the undoped $Al_{0.13}Ga_{0.87}As$ active layer 3 under the ridge stripe structure 9 produce radiative recombination, i.e., photons. If the carrier injection level is raised, a stimulated emission begins and produces a laser oscillation.

In the prior art fabricating process as described above, it is likely that dislocations may occur where an edge of the insulating film 8 along the stripe length direction and the second p type contact layer 15b come in contact as shown in FIG. 6(d). This may be due to structural forces, such as a shearing stress, between the insulating film 8 and the first p type GaAs contact layer 15a, and may happen during the second epitaxial growth step for burying the ridge stripe 9 or during the cooling process after the second epitaxial growth step. These dislocations may grow parallel to the $(1\bar{1}1)$ plane and may penetrate entirely through the region of the active layer 3 directly beneath the ridge stripe structure. If a voltage is applied to such a device having a penetrating dislocation 10, the dislocation will propagate along the $(0\bar{1}1)$ plane and the <100> dark line will grow and degrade the laser characteristics rapidly. Therefore, it will be extremely difficult to obtain a semiconductor laser having a long lifetime.

A structure of a semiconductor laser devised to solve this problem is disclosed in Japanese Published Patent Application Hei. 3-225985. FIG. 7 is a cross-sectional view illustrating the structure of this semiconductor laser. The semiconductor laser of FIG. 7 includes an n type GaAs substrate 21, an n type $In_{0.5}(Ga_{0.5}Al_{0.5})_{0.5}P$ lower cladding layer 22, an $In_{0.5}Ga_{0.5}P$ active layer 23, a first p type $In_{0.5}(Ga_{0.5}Al_{0.5})_{0.5}P$ upper cladding layer 24a, a second p type $In_{0.5}(Ga_{0.5}Al_{0.5})_{0.5}P$ upper cladding layer 24b, a p type GaAs contact layer 25, an etch stopping layer 26 comprising a superlattice layer including alternating layers of p type $In_{0.5}Ga_{0.5}P$ and p type $In_{0.5}(Ga_{0.5}Al_{0.5})_{0.5}P$, and an n type GaAs current blocking layer 27.

The method of fabricating this semiconductor laser will be described as follows. The n type lower cladding layer 22, the active layer 23, the first p type upper cladding layer 24a, the etch stopping layer 26, and the second p type upper cladding layer 24b are successively grown on the n type GaAs substrate 21 in a first epitaxial growth step. Next, using an insulating film having a stripe shape (not shown in the figure) as a mask, the second p type upper cladding layer 24b is etched to reach the etch stopping layer 26 and form a ridge stripe shape. Then, the current blocking layer 27 is grown in a second epitaxial growth step to bury the ridge stripe structure and, after removing the stripe-shaped insulating film, the p type contact layer 25 is formed on the second p type upper cladding layer 24b and the current blocking layer 27. For this semiconductor laser, during the second epitaxial growth step for forming the current blocking layer 27 or during the cooling process following the second epitaxial growth step, through dislocations originating at an edge of the stripe shaped insulating film in the stripe length direction and growing along the $(1\bar{1}1)$ plane reach the etch stopping layer 26. However, since the etch stopping layer 26 is a superlattice layer, although some of the dislocations pass through some of the layers of the interfaces between the p type $In_{0.5}Ga_{0.5}P$ layer and the p type $In_{0.5}(Ga_{0.5}Al_{0.5})_{0.5}P$ layer, the dislocations are ultimately redirected by the intermediate interfaces to a direction parallel with the surface of the etch stopping layer 26, i.e., the (001) surface. Thus, they do not penetrate the active layer 3 below the second p type upper cladding layer 24b having a ridge stripe configuration. This eliminates the problem of generation of the <100> dark lines that deteriorate laser characteristics.

As described above, in the prior art semiconductor laser shown in FIG. 7, the etch stopping layer 26 comprising a superlattice is inserted between the first p type upper cladding layer 24a on the active layer 23 and the ridge stripe-shaped second p type upper cladding layer 24b, so that growth of dislocations penetrating into the active region is prevented. However, in the usual buried ridge type semiconductor laser, since the thickness of the upper cladding layer between the ridge stripe structure and the active layer is quite thin, about 0.3 μm, if the etch stopping layer 26 is placed under the second p type upper cladding layer 24b in the ridge stripe structure, the laser light generated at the active region of the active layer 23 and usually broadened to about 0.5 μm from this active region will be absorbed by the etch stopping layer 26 comprising the superlattice. This results in a large optical loss in the waveguide, seriously adversely affecting the characteristics of the semiconductor laser.

SUMMARY OF THE INVENTION

It is an object of the present invention to fabricate a semiconductor laser that produces no dislocations penetrating through an active region so that loss of light in the waveguide is suppressed and a semiconductor laser with a long lifetime and superior laser characteristics is obtained.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser comprises a semiconductor substrate, a first conductivity type cladding layer disposed on the substrate, an active layer disposed on the first conductivity type cladding layer, and a first second conductivity type cladding layer disposed on the active layer. It further includes a ridge stripe structure of a second conductivity type semiconductor located on the first second conductivity type cladding layer and having a superlattice layer disposed parallel to the surface of the substrate and a layer including a current blocking layer burying the ridge stripe structure. Therefore, the growth direction of dislocations generated when the ridge stripe structure is buried with semiconductor layers, including the current blocking layer, is changed by the superlattice layer and dislocations penetrating through the laser active region are prevented. There is also provided a sufficient distance between the superlattice layer and the active layer so that loss of light in the waveguide is prevented.

According to a second aspect of the present invention, in the semiconductor laser, the ridge stripe structure comprises a second second conductivity type cladding layer, a first second conductivity type contact layer disposed on the second second conductivity type cladding layer, the superlattice layer disposed on the first contact layer, and a second second conductivity type contact layer disposed on the superlattice layer. Therefore, the growth direction of dislocations generated when the ridge stripe structure is buried with semiconductor layers, including the current blocking layer, is changed by the superlattice layer and dislocations penetrating through the laser active region are prevented. There is also provided a sufficient distance between the superlattice layer and the active layer so that loss of light from the waveguide is prevented.

According to a third aspect of the present invention, in the semiconductor laser, the ridge stripe structure comprises a second second conductivity type cladding layer, the superlattice layer disposed on the second second conductivity type cladding layer at a position so that laser light generated at the active layer does not reach, and a third second conductivity type cladding layer disposed on the superlattice layer. Therefore, the growth direction of the dislocations generated when the ridge stripe structure is buried with semiconductor layers, including the current blocking layer, is changed by the superlattice layer and dislocations penetrating through the laser active region are prevented. There is also provided a sufficient distance between the superlattice layer and the active layer so that loss of light from the waveguide is prevented.

According to a fourth aspect of the present invention, in the semiconductor laser, the ridge stripe structure comprises a second second conductivity type cladding layer, the superlattice layer disposed on the second second conductivity type cladding layer, and a second conductivity type contact layer disposed on the superlattice layer. Therefore, the growth direction of the dislocations generated when the ridge stripe structure is buried with semiconductor layers, including the current blocking layer, is changed by the superlattice layer and dislocations penetrating through the laser active region are prevented. There is also provided a sufficient distance between the superlattice layer and the active layer so that loss of light from the waveguide is prevented.

BRIEF DESCRIPTION OF THE DRAWINGS

FIGS. 2(a) to 2(d) are cross-sectional views illustrating a method of fabricating a semiconductor laser in accordance with the first embodiment of the present invention.

FIGS. 6(a) to 6(d) are cross-sectional views illustrating a process of fabricating a prior art semiconductor laser.

DETAILED DESCRIPTION OF THE PREFERRED EMBODIMENTS

Embodiment 1

Figure 1:
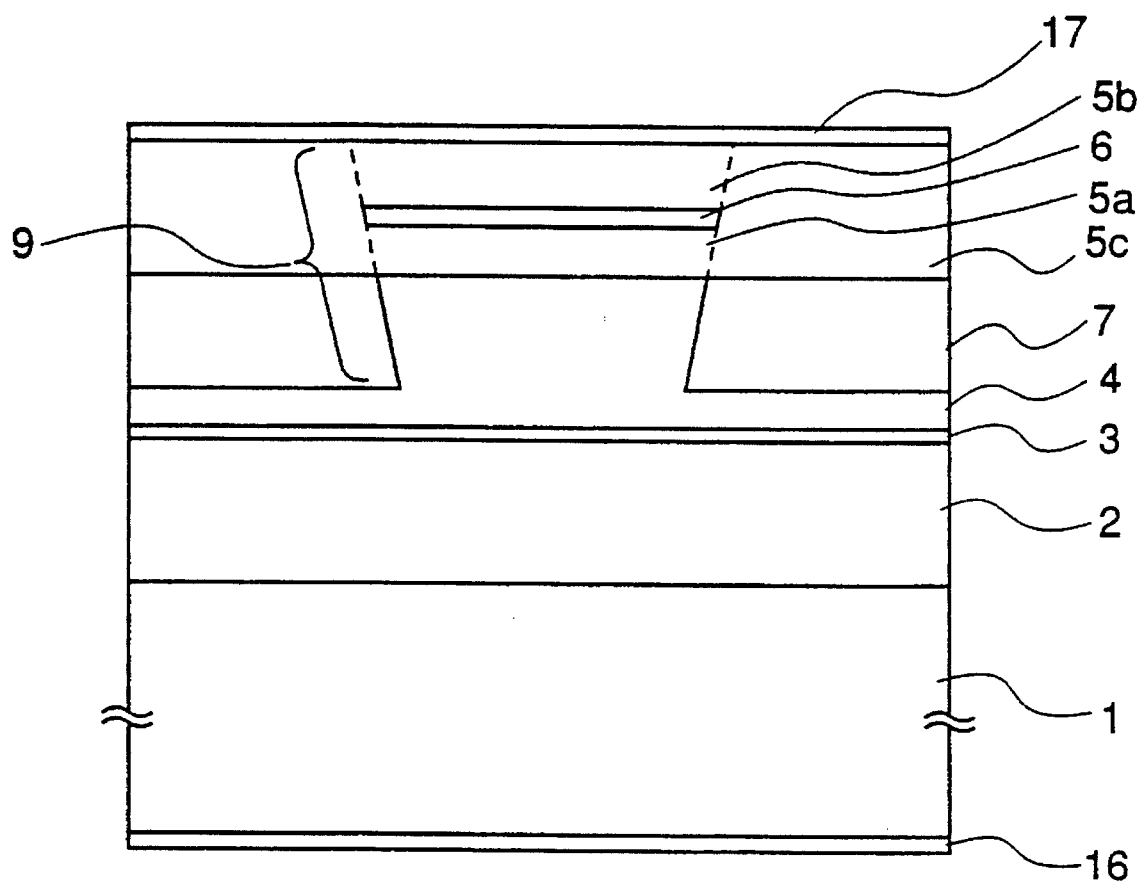
FIG. 1 is a cross-sectional view illustrating the structure of a semiconductor laser in accordance with a first embodiment of the present invention.

FIG. 1 is a cross-sectional view illustrating the structure of a semiconductor laser in accordance with a first embodiment of this invention including an n type GaAs substrate 1 including impurities, such as Si, in a concentration of 1 to $3\times10^{18}$ cm$^{-3}$. An n type $Al_{0.48}Ga_{0.52}As$ lower cladding layer 2 including impurities, such as Se, in a concentration of $4\times10^{17}$ cm$^{-3}$ and having a thickness of about 1.5 µm is disposed on the n type GaAs substrate 1. An undoped $Al_{0.13}Ga_{0.87}As$ active layer 3 having a thickness of about 0.05 µm is disposed on the n type lower cladding layer 2. A p type $Al_{0.48}Ga_{0.52}As$ upper cladding layer 4 including impurities, such as Zn, in a concentration of $2\times10^{18}$ cm$^{-3}$ is disposed on the active layer 3. The thickest part of the p type upper cladding layer 4 is about 1.3 µm thick and the thinnest part is about 0.3 µm thick. Furthermore, a first p type GaAs contact layer 5a including impurities, such as Zn, in a concentration of $2\times10^{19}$ cm$^{-3}$ is disposed on the p type upper cladding layer 4. A superlattice layer 6 is disposed on the p type GaAs contact layer 5a. This superlattice layer 6 comprises ten periods of alternating AlAs layers and GaAs layers, the thickness of each being 10 nm. A second p type GaAs contact layer 5b including impurities, such as Zn, in a concentration of $2\times10^{19}$ cm$^{-3}$ is disposed on the superlattice layer 6. A ridge stripe structure 9 comprises the second contact layer 5b, the superlattice layer 6, the first contact layer 5a, and the upper portion of the p type upper cladding layer 4. The width of this ridge stripe structure at the p type upper cladding layer 4 side is about 3.5 µm. An n type GaAs current blocking layer 7 including impurities, such as Se, in a concentration of $6\times10^{18}$ cm$^{-3}$ and having a thickness of about 1 µm buries the p type upper cladding layer 4 of the ridge stripe structure 9. A third p type GaAs contact layer 5c including impurities, such as Zn, in a concentration of $2\times10^{19}$ cm$^{-3}$ and having a thickness of about 3 µm buries the first contact layer 5a, the superlattice layer 6, and the second contact layer 5b of the ridge stripe structure. A p side electrode 17 comprising Ti/Pt/Au and having a thickness of about 350 nm is disposed on the third p type GaAs contact layer 5c and the second p type contact layer 5b, and an n side electrode 16 comprising AuGe/Pt/Au and having a thickness of about 300 nm is disposed on the n type substrate 1.

FIGS. 2(a) to 2(d) are cross-sectional views illustrating a method of fabricating a semiconductor laser in accordance with the first embodiment of the invention in which the same reference numerals used in FIG. 1 designate the same or corresponding elements. Reference numeral 8 designates an insulating film having a stripe configuration comprising a material, such as SiON or SiN, and extending in the <110> direction. Reference numeral 10 designates a through dislocation.

A description is given of the fabrication. First, the n type $Al_{0.48}Ga_{0.52}As$ cladding layer 2, the undoped $Al_{0.13}Ga_{0.87}As$ active layer 3, the p type $Al_{0.48}Ga_{0.52}As$ cladding layer 4, the p type GaAs contact layer 5a, the superlattice layer 6, and the p type GaAs contact layer 5b are epitaxially grown on the (001) surface of the n type GaAs substrate 1, in this order, in a first epitaxial growth step, using reduced pressure MOCVD, thereby producing the semiconductor layer structure shown in FIG. 2(a). Next, as shown in FIG. 2(b), the SiON film 8 having a stripe configuration extending in the <110> direction is formed on the semiconductor layer structure. The thickness of the SiON film 8 is 50 to 100 nm and a method, such as plasma CVD, is used to deposit the film. Next, using the stripe-shaped SiON film 8 as an etching mask, the semiconductor layer structure obtained through the first epitaxial growth is etched until it reaches a part of the p type $Al_{0.48}Ga_{0.52}As$ upper cladding layer 4 so that the ridge stripe structure 9 is formed (FIG. 2(c)). An example of an etching solution used is a mixture of sulfuric acid and hydrogen peroxide. The p type upper cladding layer 4 is left with a thickness of about 0.3 µm after the etching. In order to control the remaining thickness of the upper cladding layer 4 with high precision, an etch stopping layer (not shown in the figure) may be located at a position about 0.3 µm from the active layer, with the upper cladding layer comprising two parts, i.e., the p type first cladding layer and the p type second cladding layer. This procedure ensures that the etching is properly halted by the etch stopping layer, leaving precisely the thickness of the upper cladding layer intended. Next, the n type GaAs current blocking layer 7 and the third p type GaAs contact layer 5c are successively grown in a second epitaxial growth step to bury the ridge stripe structure 9 using reduced pressure MOCVD. Finally, the semiconductor layer structure obtained through the second epitaxial growth step is cooled (FIG. 2(d)) and, after removing the insulating film 8, the p side electrode 17 and the n side electrode 16 are formed, resulting in the semiconductor laser shown in FIG. 1.

Next, the operation will be described. When a bias voltage is applied across the p side electrode 17 and the n side electrode 16, i.e., between the p type GaAs contact layers 5a and 5c and the n type GaAs substrate 1, so that the p type GaAs contact layers 5a and 5c become positive, an electrical current only flows through the ridge stripe structure 9. Electrons and holes are injected into the region of the undoped $Al_{0.13}Ga_{0.87}As$ active layer 3 under the ridge stripe structure 9 and produce radiative recombination, i.e., photons. If the injection level is raised, stimulated emission begins, producing laser oscillation.

Even in the semiconductor laser of the present embodiment, as in the prior art semiconductor laser, dislocations may occur at a point where an edge of the insulating film 8 and the third contact layer 5c come in contact with each other during the second epitaxial growth step or the cooling process following the second epitaxial growth step. This is due to structural forces, such as a shearing stress, between the SiON insulating film 8 and the third contact layer 5c. These dislocations may propagate like the through dislocations toward the active layer 3 in a direction parallel to the $(1\bar{1}1)$ plane, through the semiconductor layer structure shown in FIG. 2(d). However, it is a property of semiconductor crystals that a direction of dislocation propagation is diverted where a lattice strain is present inside the crystals. Therefore, when the dislocation, produced to compensate for localized strains, reaches the superlattice layer 6, the propagation direction of the dislocation is diverted at the interface of the AlAs layer and the GaAs superlattice layer. The dislocations thus grow along the (001) plane because the lattice strain is uniform in the superlattice layer 6. Therefore, the through dislocations propagating in the direction parallel to the $(1\bar{1}1)$ plane are redirected at an interface between the AlAs layer and the GaAs layer to a direction parallel to the (001) plane and grow toward the third contact layer 5c. For this reason, the through dislocations 10 generated at the surface of the semiconductor layer structure do not penetrate the laser active region, that is, the region of the active layer 3 under the ridge stripe structure 9. Therefore, the <100> dark lines which might be generated as a result of the through dislocations in the laser active region are suppressed and a semiconductor laser with a long lifetime is obtained.

Furthermore, in the semiconductor laser of this embodiment, as shown in FIG. 1, the superlattice layer 6, which prevents the through dislocations 10 from growing toward the laser active region, is between the contact layers 5a and 5b of the ridge stripe structure 9, which are separated from the active layer 3 by the p type cladding layer 4. Therefore, there is at least a distance of 1.3 μm between the active region of the active layer 3 and the superlattice layer 6. Laser light produced in the active region of the active layer 3 is not absorbed by the superlattice layer 6 because a significant amount of the laser light exists at a region about 0.5 μm from the active region of the active layer 3. Therefore, this semiconductor laser differs from the semiconductor laser disclosed in Japanese Published Patent Application Hei. 3-225985 in that there is no deterioration of laser characteristics due to the absorption of laser light by the superlattice layer 6.

In the first embodiment of the present invention, the superlattice layer 6 comprising AlAs layers and GaAs layers is disposed between the contact layers 5a and 5b of the ridge stripe structure 9 so that the propagation direction of the dislocations, generated when the ridge stripe structure 9 is buried with the current blocking layer 7 and the third contact layer 5c, is changed by the superlattice layer 6. Dislocations penetrating through the laser active region are thus prevented. There is also provided a sufficient distance between the superlattice layer 6 and the active layer 3 so that absorption loss of light due to the superlattice layer is prevented. Therefore, a semiconductor laser that is less likely to have <100> dark lines and that has a long lifetime, high performance, and high reliability is obtained.

Embodiment 2

Figure 3:
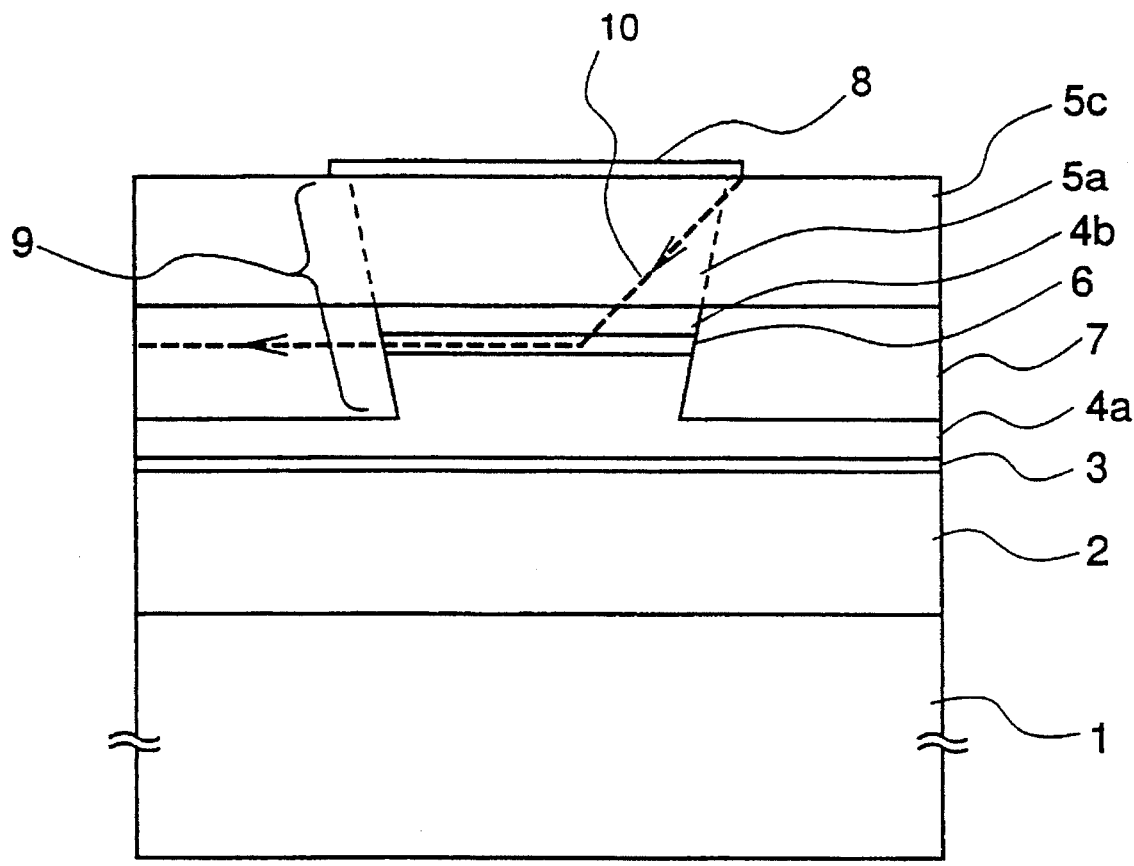
FIG. 3 is a cross-sectional view illustrating a process of forming a current blocking layer and a contact layer in a method of fabricating a semiconductor laser in accordance with a second embodiment of the present invention.

FIG. 3 shows the structure of a semiconductor laser in accordance with a second embodiment of the present invention. FIG. 3 is a cross-sectional view illustrating the process of forming a current blocking layer and a contact layer burying a ridge stripe structure when fabricating a semiconductor laser according to the second embodiment of the present invention. In the figure, the same reference numerals used in FIGS. 2(a) to 2(d) designate the same or corresponding elements. A first p type $Al_{0.48}Ga_{0.52}As$ upper cladding layer 4a is disposed on the active layer 3 and a top part of the upper cladding layer 4a forms a part of the ridge stripe structure 9. A second p type $Al_{0.48}Ga_{0.52}As$ upper cladding layer is disposed on the first upper cladding layer with the superlattice layer 6 between the first and second upper cladding layers. The first upper cladding layer 4a and the second upper cladding layer 4b are parts of the p type upper cladding layer 4.

While in the first embodiment the superlattice layer 6 is located between the first and second p type contact layers 5a and 5b of the ridge stripe structure 9, the superlattice layer 6 is located between the first p type upper cladding layer 4a and the second p type upper cladding layer 4b of the ridge stripe structure 9 in the second embodiment of the invention. After the n type lower cladding layer 2, the active layer 3, the first upper cladding layer 4a, the superlattice layer 6, the second upper cladding layer 4b, and the contact layer 5a are epitaxially grown in this order in a first epitaxial growth step on the substrate 1. As in the first embodiment, the ridge stripe structure 9 is formed by etching using the insulating film 8 having a stripe configuration. As shown in FIG. 3, the n type current blocking layer 7 and the p type contact layer 5c are formed in a second epitaxial growth step, burying the ridge stripe structure 9.

Also in this embodiment, the dislocations 10 that are generated at an edge of the insulating film 8 on the surface of the semiconductor layer structure during the second epitaxial growth step, i.e., growing the n type current blocking layer 7 and the p type contact layer 5c to bury the ridge stripe structure 9, or during the cooling of the semiconductor layer structure after the second epitaxial growth step, are redirected to propagate in a direction parallel to the interfaces of layers of the superlattice layer 6. Therefore, generation of the through dislocations in the laser active region, which would be sources of the <100> dark lines, is prevented.

In the second embodiment, in order to prevent the laser light, which is broadened, from the active layer 3 from being absorbed by the superlattice layer 6, the cladding layer 4a separating the superlattice layer 6 and the active layer 3 has such a thickness that the superlattice layer 6 is not in the region where the laser light is present. For example, if the laser light is broadened in a range of 0.5 μm from the active layer, the cladding layer 4a has a thickness of 0.5 μm or more.

Since in this embodiment, the superlattice layer 6 is disposed between the first p type upper cladding layer 4a and the second p type cladding layer 4b, the same effects as in the first embodiment are obtained.

Embodiment 3

Figure 4:
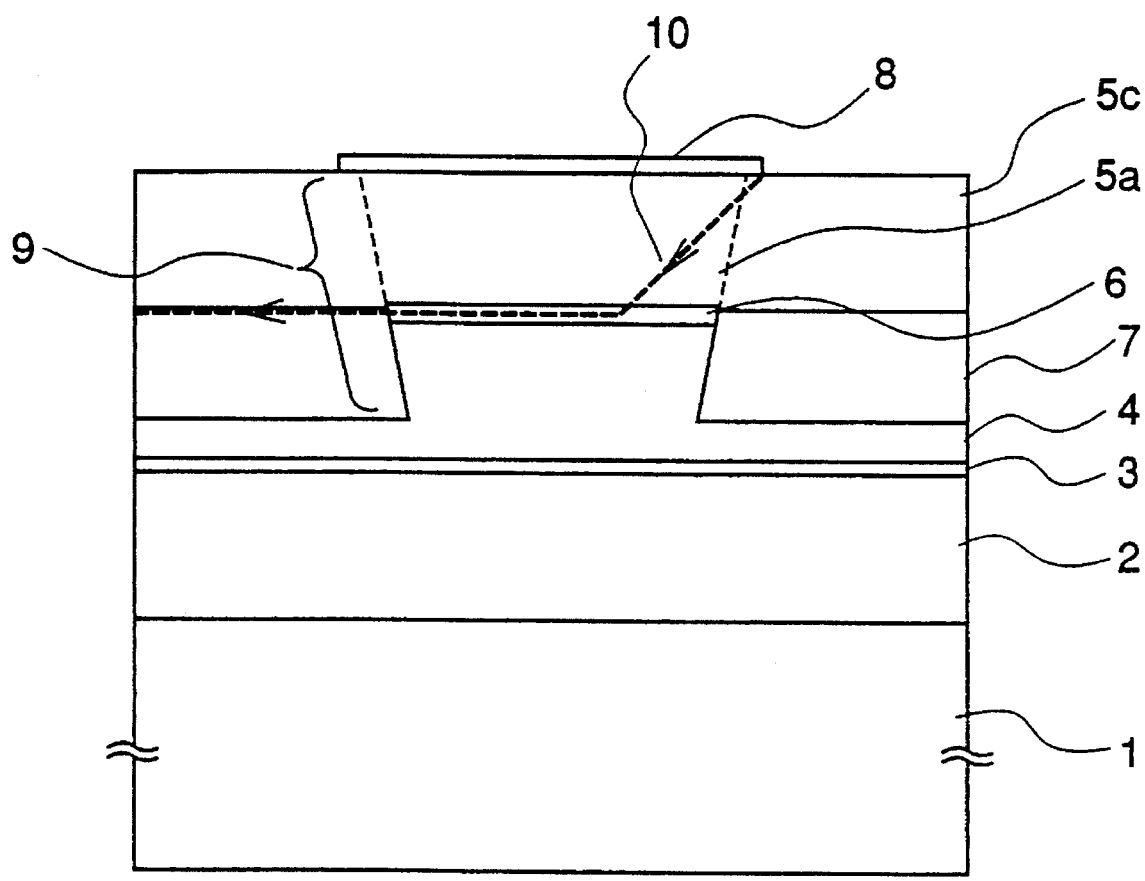
FIG. 4 is a cross-sectional view illustrating a process of forming a current blocking layer and a contact layer in a method of fabricating a semiconductor laser in accordance with a third embodiment of the present invention.
Figure 5:
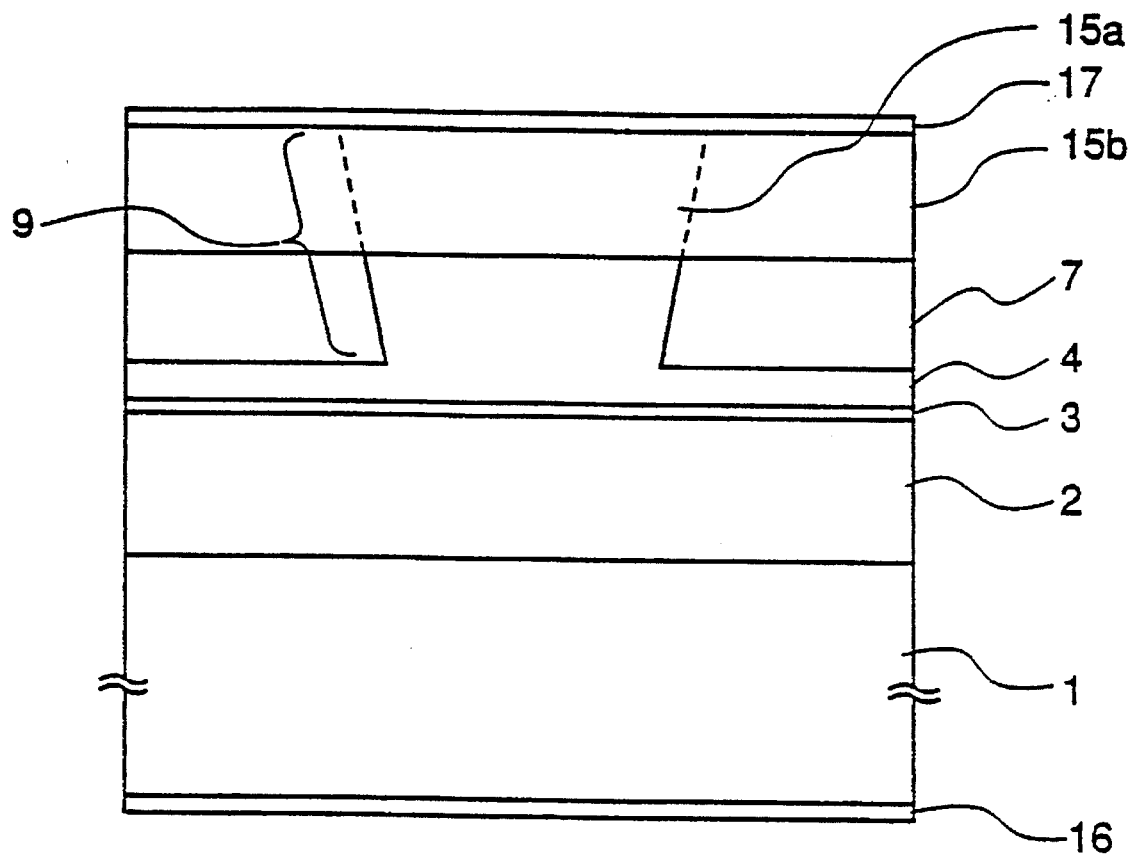
FIG. 5 is a cross-sectional view illustrating the structure of a conventional semiconductor laser.
Figure 7:
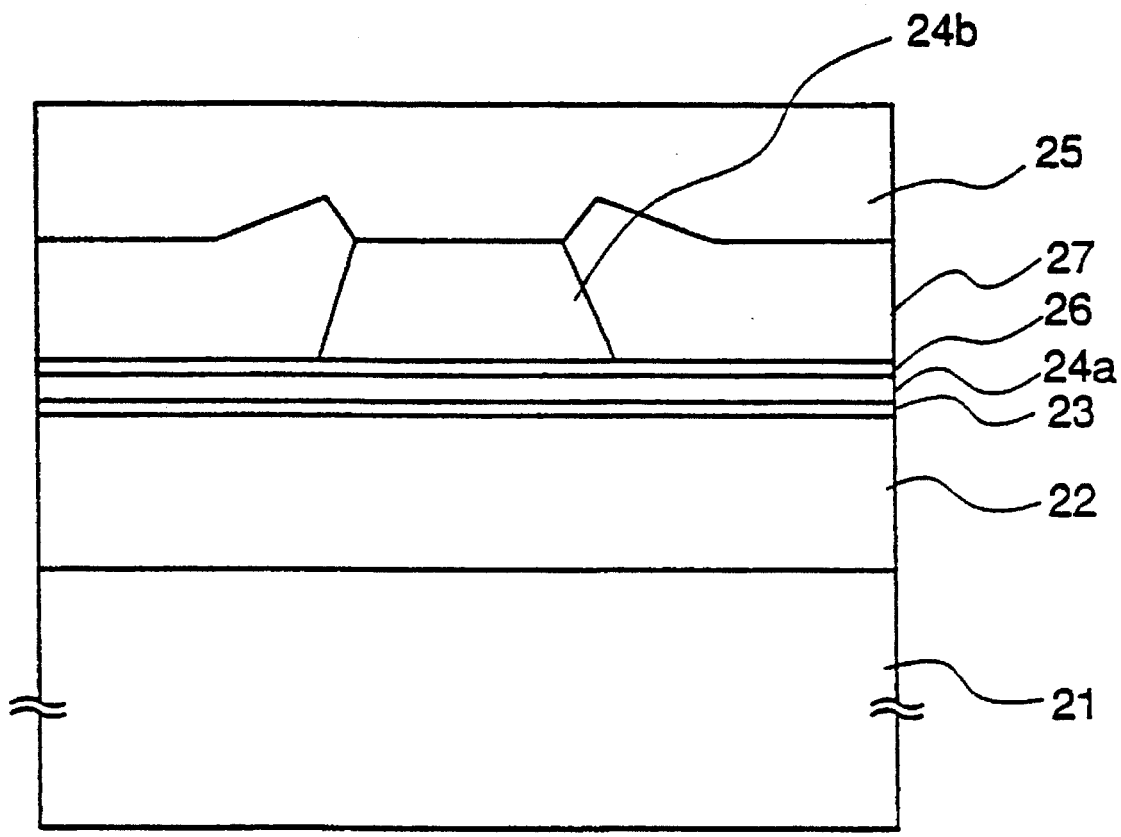
FIG. 7 is a cross-sectional view illustrating the structure of another prior art semiconductor laser.

FIG. 4 shows the structure of a semiconductor laser in accordance with a third embodiment of the present invention. It is a cross-sectional view illustrating the process of forming a current blocking layer and a contact layer to bury a ridge stripe structure when fabricating a semiconductor laser according to the third embodiment of the invention. In the figure, the same reference numerals used in FIGS. 2(a) to 2(d) designate the same or corresponding elements.

While in the first embodiment the superlattice layer 6 is placed between the first and second p type contact layers 5a and 5b of the ridge stripe structure 9, in this third embodiment the superlattice layer 6 is placed between the p type upper cladding layer 4 and the p type contact layer 5a of the ridge stripe structure 9. After the n type lower cladding layer 2, the active layer 3, the p type upper cladding layer 4, the superlattice layer 6, and the p type contact layer 5a are epitaxially grown in this order in a first epitaxial growth step on the substrate 1, as in the first embodiment, the ridge stripe structure 9 is formed by etching using the insulating film 8 having a stripe configuration as a mask. As shown in FIG. 4, the n type current blocking layer 7 and the p type contact layer 5c are epitaxially grown in a second epitaxial growth step, burying the ridge stripe structure 9.

Also in this third embodiment, the dislocations 10 generated at an edge of the insulating film 8 either during the second epitaxial growth step, i.e., growing the n type current blocking layer 7 and the p type contact layer 5c, or during the cooling process after the second epitaxial growth step, are redirected to propagate in a direction parallel to the interfaces of the superlattice layer 6. Therefore, generation of through dislocations in the laser active region, which would be sources of the <100> dark lines, is prevented.

Furthermore, in the third embodiment, the ridge portion of the cladding layer 4 between the superlattice layer 6 and the active layer 3 is about 1.3 μm thick. This thickness prevents the laser light from being absorbed by the superlattice layer 6.

In the third embodiment, since the superlattice layer 6 is disposed between the p type upper cladding layer 4 and the p type contact layer 5a, in the ridge stripe structure 9, the same effect as in the first embodiment is obtained While in the three embodiments described, the superlattice layer comprises AlAs layers and GaAs layers, this invention can be applied to superlattice layers having different compositions, such as one comprising AlGaAs layers and GaAs layers or one comprising InGaAs layers and GaAs layers. The same effects as in the first embodiment are obtained.

While in the three embodiments described, the superlattice layer comprises ten periods of alternating AlAs layers and GaAs layers, there is no restriction on the number of individual layers of the superlattice layer. It should, however, be noted that the more layers the superlattice layer has, the more likely the generation of the through dislocations is prevented, resulting in a semiconductor laser having high reliability.

Furthermore, while in the three embodiments described, GaAs series semiconductor lasers are described, the present invention can also be applied to semiconductor lasers having other compositions, such as an InP series semiconductor laser. The same effects as in the three described embodiments are obtained.

What is claimed is:

1. A semiconductor laser comprising:

a semiconductor substrate having a surface;

a first conductivity type first cladding layer disposed on the surface of said semiconductor substrate;

an active layer disposed on said first cladding layer;

a second conductivity type second cladding layer disposed on said active layer;

a ridge stripe structure having opposed sides and including part of said second cladding layer and further including, successively disposed, a first contact layer of the second conductivity type disposed on said second cladding layer, a superlattice layer parallel to the surface of said substrate and disposed on said first contact layer, and a second contact layer of the second conductivity type disposed on said superlattice layer; and a layer including a current blocking layer contacting the sides of said ridge stripe structure.

2. The semiconductor laser of claim 1 wherein said current blocking has the first conductivity type and including a third contact layer of the second conductivity type disposed on said current blocking layer and contacting the sides of said ridge stripe structure.

3. The semiconductor laser of claim 2 wherein interfaces of said current blocking layer and said third contact layer and of said second cladding layer and said first contact layer are substantially coplanar.

4. A semiconductor laser comprising:

a semiconductor substrate having a surface;

a first conductivity type first cladding layer disposed on the surface of said semiconductor substrate;

an active layer disposed on said first cladding layer;

a second conductivity type second cladding layer disposed on said active layer;

a ridge stripe structure having opposed sides and including part of said second cladding layer and further including, successively disposed, a superlattice layer parallel to the surface of said substrate and disposed on said second cladding layer, a third cladding layer of the second conductivity type disposed on said superlattice layer, said superlattice layer being disposed on said second cladding layer at a position not reached by laser light generated in said active layer, and a first contact layer of the second conductivity type disposed on said third cladding layer; and a layer including a current blocking layer contacting the sides of said ridge stripe structure.

5. The semiconductor laser of claim 4 wherein said current blocking layer has the first conductivity type and including a second contact layer of the second conductivity type disposed on said current blocking layer and contacting the sides of said ridge stripe structure.

6. The semiconductor laser of claim 5 wherein interfaces of said current blocking layer and said second contact layer and of said third cladding layer and said first contact layer are substantially coplanar.

7. A semiconductor laser comprising:

a semiconductor substrate having a surface;

a first conductivity type first cladding layer disposed on the surface of said semiconductor substrate;

an active layer disposed on said first cladding layer;

a second conductivity type second cladding layer disposed on said active layer;

a ridge stripe structure having opposed sides and including part of said second cladding layer and further including, successively disposed, a superlattice layer parallel to the surface of said substrate and disposed on said second cladding layer, and a first contact layer of the second conductivity type disposed on said superlattice layer, said superlattice layer being disposed on said second cladding layer at a position not reached by laser light generated at said active layer; and a layer including a current blocking layer contacting the sides of said ridge stripe structure.

8. The semiconductor laser of claim 7 wherein said current blocking layer has the first conductivity type and including a second contact layer of the second conductivity type disposed on said current blocking layer and contacting the sides of said ridge stripe structure.

* * * * *